United States Patent [19]

Yuasa et al.

[11] Patent Number: 5,096,800

[45] Date of Patent: Mar. 17, 1992

[54] RESIN COMPOSITION FOR FORMING DURABLE PROTECTION COATING AND PROCESS FOR FORMING DURABLE PROTECTION COATING ON SUBSTRATE

[75] Inventors: Hitoshi Yuasa; Eiji Yoda, both of Yokohama; Haruyoshi Sato, Kawasaki; Yutaka Otsuki, Yokohama, all of Japan

[73] Assignee: Nippon Oil Company, Ltd., Tokyo, Japan

[21] Appl. No.: 618,387

[22] Filed: Nov. 27, 1990

[30] Foreign Application Priority Data

Nov. 28, 1989 [JP] Japan ................................. 1-306586

[51] Int. Cl.$^5$ .......................... G03C 1/725; C08F 2/46
[52] U.S. Cl. ..................................... 430/286; 430/287; 430/281; 522/95; 522/102; 522/106
[58] Field of Search ...................... 430/286, 287, 281; 522/95, 102, 106

[56] References Cited

U.S. PATENT DOCUMENTS 4,639,080  1/1987  Kimura et al. ...................... 522/90
4,927,739  5/1990  Taniguchi et al. .................. 430/286

Primary Examiner—Marion E. McCamish
Assistant Examiner—Mark A. Chapman
Attorney, Agent, or Firm—Majestic, Parsons, Siebert & Hsue

[57] ABSTRACT

A resin composition for forming a durable protection coating contains (A) an alkali-soluble resin which is a polymer of a conjugated diene and has a monoamidated succinic acid group represented by the following formula (I) of:

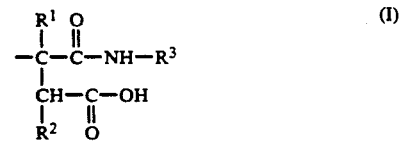

wherein $R^1$ and $R^2$ each stand for a hydrogen atom, a halogen atom or an organic residue having 1 to 3 carbon atoms; and $R^3$ stands for an organic residue having 1 to 16 carbon atoms; (B) a pre-polymer having a photosensitive ethylenic double bond; and (C) a photopolymerization initiator. The mixing ratio by weight of the alkali-soluble resin (A) to the pre-polymer (B) ranges from 1:4 to 4:1. A process for preparing the durable protection coating contains applying the resin composition on a substrate, and exposing the resin composition to ultraviolet ray through a circuit pattern mask to cure the resin composition followed by development and after-curing to form the protection coating.

23 Claims, No Drawings

RESIN COMPOSITION FOR FORMING DURABLE PROTECTION COATING AND PROCESS FOR FORMING DURABLE PROTECTION COATING ON SUBSTRATE

BACKGROUND OF THE INVENTION

The present invention relates to a resin composition for forming a durable protection coating, which may be used as a solder resist, a marking or a solder leveller, on a substrate such as a printed circuit board, and to a process for forming such a durable protection coating or layer by applying the aforementioned resin composition on the substrate followed by curing.

As the integration degree of printed circuit boards progressively advances higher and higher from year to year, it is required in recent years to draw three or even more lines through respective zones between adjacent IC lands. Accordingly, it becomes necessary to provide a durable protection coating which serves, for example, as a solder resist and is capable of accommodating such a high integration degree to ensure that the circuit board has satisfactory reliability. However, when preparing such a durable protection coating by the use of a conventional thermosetting resin compositions, since a pattern must be formed through silk screen printing, there often arises a problem that a fine pattern cannot be formed due to dislocation caused by slacking of the silk screen. Ultraviolet ray curing type compositions capable of forming fine patterns have been frequently used up to date. On the other hand, although compositions which can be developed by various organic solvents have heretofore been used, in order to improve the working environment or in order to simplify and lessen the size of entire installation, organic solvent developed type compositions have been gradually replaced by resin compositions developable with alkalis. Such replacement is also desirable for saving resources and energies with attendant improvement in operation efficiency and producibility.

As should be understood from the foregoing, resin compositions which are capable of forming superfine or micro patterns upon curing by exposure to ultraviolet ray, and then developed with an alkali, are the most preferable materials for the formation of durable protection layers or coatings. Development of such resin compositions is thus earnestly desired. However, such a resin composition, which can be cured upon exposure to ultraviolet ray and developed with an alkali to form a durable or lasting protection coating while satisfying the required adaptability to higher degree integration of the circuit pattern and having satisfactory reliability, has not yet been found. Some reasons therefor would be noticed, the first reason being that the resin compositions developed with an alkali has a disadvantage that the carboxylic acid groups which are indispensable for the development with an alkali remain in the resultant coating after it is formed, leading to the result that the formed coating has poor moistureproof properties, insufficient resistance to chemicals and hydrolysis and unsatisfactory adhesiveness. The more serious problem induced by the known resin compositions, when they are applied on a printed circuit board, is that carboxylic acid groups in the resin corrode a copper foil forming the printed circuit to deteriorate the properties of the substrate. In order to obviate such problems, it is reluctantly compelled to use resins each containing an acid value of not more than about 50 mg KOH/g, resulting in unsatisfactory resolving power of the resin after exposure and subsequent development thereof. On the other hand, resin compositions commercially available today have disadvantages that they are unsatisfactory in resistance to chemicals and solvents and have low reliability when they are cured in the form of thick coatings. When a durable or lasting protection coating is prepared by using a resin composition which is cured by exposure to ultraviolet ray, since a circuit pattern forming mask must be closely fitted over the resin coating at the step of exposing the coating to ultraviolet ray, it is requisite that the coating should not have tack or stickiness. More particularly, it is necessary that the coating does not exhibit tack by the finger touch test at ambient temperature before it is exposed to light.

SUMMARY OF THE INVENTION

An object of this invention is to provide a resin composition for forming a durable protection coating which is excellent in moistureproof properties, and resistance to chemicals and has high adhesiveness.

Another object of this invention is to provide a resin composition for forming a dense durable protection coating which is excellent in curing properties when used to form a thick coating layer.

A further object of this invention is to provide a process for preparing a durable coating, which is excellent in curing properties when used to form a thick coating through simple steps with good operation efficiency.

The above and other objects of the invention will become apparent from the following description.

According to the present invention, there is provided a resin composition for forming a durable protection coating comprising: (A) an alkali-soluble resin which is a polymer of a conjugated diene and has a monoamidated succinic acid group represented by the following formula (I) of:

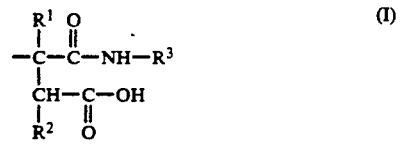

wherein $R^1$ and $R^2$ each stand for a hydrogen atom, a halogen atom or an organic residue having 1 to 3 carbon atoms; and $R^3$ stands for an organic residue having 1 to 16 carbon atoms; (B) a pre-polymer having a photosensitive ethylenic double bond; and (C) a photopolymerization initiator; a mixing ratio by weight of the alkali-soluble resin (A) to the pre-polymer (B) ranging from 1:4 to 4:1.

A process for preparing a durable protection coating, provided in accordance with an additional aspect of the invention, comprises the steps of applying the above defined resin composition on a substrate to form a photosensitive coating, exposing the thus formed coating to ultraviolet ray through a circuit pattern mask to cure the exposed portion of the coating, removing the unexposed portion of the coating by development with an alkali to reveal a circuit pattern, and then converting the monoamidated succinic acid group in the coating into an imidated succinic acid group.

PREFERRED EMBODIMENTS OF THE INVENTION

The present invention will now be described in detail hereinbelow.

The resin composition for forming a durable protection coating, according to the invention, contains an alkali-soluble resin (component (A)), a pre-polymer (component (B)) and a photopolymerization initiator (component (C)), the mixing ratio of the component (A) to the component (B) ranging within a defined mixing ratio by weight of 1:4 to 4:1.

The alkali-soluble resins which may be used as the component (A) in the invention, include a polymer of a conjugated diene including copolymers thereof and having at least one monoamidated succinic acid group represented by the following formula (I) bonded to the polymer chain. The specific examples of the polymers are oligomers of conjugated diolefins having 4 or 5 carbon atoms such as butadine and isoprene, low polymerization degree copolymers of one or more of conjugated diolefines as referred to above with aliphatic or aromatic monomers each having an ethylenically unsaturated double bond excluding $C_4$ and $C_5$ conjugated diolefines, such as isobutylene, diisobutylene, styrene, $\alpha$-methylstyrene, vinyltoluene, divinyltoluene, and mixtures of such oligomers and low polymerization degree copolymers.

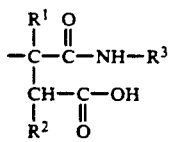
(I)

In the formula (I), $R^1$ and $R^2$ each stand for a hydrogen atom, a halogen atom or an organic residue having 1 to 3 carbon atoms such as a methyl group, an ethyl group or a propyl group; and $R^3$ stands for an organic residue having 1 to 16 carbon atoms such as a methyl group, an isopropyl group, a butyl group, a cyclohexyl group, a lauryl group or a benzyl group. $R^1$ and/or $R^2$ each having not less than 4 carbon atoms are not suitable and $R_3$ having not less than 17 carbon atoms is not suitable, as well, because of difficulty encountered in preparation of the alkali-soluble resin. The content of the monoamidated succinic acid group represented by the formula (I) may range preferably from 0.05 to 1.5 mols, particularly preferably from 0.1 to 1.2 mols, based on 100 g of the polymer of the conjugated diene. If the content of the monoamidated succinic acid group is less than 0.05 mol, the resultant component (A) may become insoluble in alkali; whereas it is not preferred from the economical standpoint of view to set the content thereof more than 1.5 mols.

The ratio of the numbers of the vinyl groups relative to the numbers of the total unsaturated double bonds present in the polymer of the conjugated diene may range preferably not less than 50%, particularly preferably within the range of from 50 to 80%, further preferably within the range of from 55 to 70%. It is not preferred to use the polymer of the conjugated diene, in which the ratio of the numbers of the vinyl groups relative to the numbers of the total double bonds is less than 50%, since the density of cross-linking becomes low. On the other hand, the polymer of conjugated diene may preferably have a number average molecular weight of from 500 to 5,000. The strength of the resultant coating is lowered if the molecular weight is less than 500, whereas it becomes impossible to form a smooth coating when the molecular weight exceeds 5,000.

In the present invention, the polymer of the conjugated diene having a monoamidated succinic acid group which is used as the component (A), i.e. the alkali-soluble resin, may be prepared or synthesized, for example, by adding an $\alpha,\beta$-dicarboxylic anhydride to a polymer of conjugated diene, followed by monoamidation with a primary amine having 1 to 16 carbon atoms. For example, a specific oligomer of a conjugated diene may be prepared initially by anionically polymerizing, in the presence of a catalyst such as an alkali metal or an organic compound of an alkali metal usually at a temperature of from 0° C. to 100° C., $C_4$ or $C_5$ conjugated diolefins, a mixture thereof or conjugated diolefins with an aromatic vinyl monomer selected from the group consisting of styrene, $\alpha$-methylstyrene, vinyltoluene, divinylbenzene and mixtures thereof, the ratio of the aromatic vinyl monomer mixed with the olefin or olefins ranging preferably not more than 50 mol %, more preferably from 1 to 30 mol %. In order to control the molecular weight to prepare a light color oligomer which is low in percentage gelation, the aforementioned anionic polymerization may be carried out through the chain transfer polymerization process (disclosed in U.S. Pat. No. 3,789,090) wherein toluene is used as the chain transferring agent and an organic compound of an alkali metal, such as benzyl sodium, is used as a catalyst; through the living polymerization process (disclosed in Japanese Patent Publication Nos. 17485/1967 and 27432/1968) wherein a polycyclic compound such as naphthalene is used as an activator in a tetrahydrofuran as the solvent and an alkali metal, such as sodium, is used as the catalyst; or through the polymerization process (disclosed in Japanese Patent Publication Nos. 7446/1957, 1245/1958 and 10188/1956) wherein the molecular weight is controlled by the use of an aromatic hydrocarbon, such as toluene, xylene, etc., as the solvent, and a metal dispersion, such as a dispersion of sodium, as the catalyst, with the addition of an ether such as dioxane. As the oligomer of the conjugated diene, usable are oligomers each prepared through a coordination anionic polymerization wherein an acetyl acetonate compound of a Group VIII metal in the Periodic Table (such as cobalt, nickel, etc.) or an alkyl aluminum halogenide is used as the catalyst (see Japanese Patent Publication Nos. 507/1970 and 30300/1971). Then, an addition product of acid anhydride groups may be prepared by adding an $\alpha,\beta$-unsaturated dicarboxylic anhydride to the polymer of the conjugated diene. Such an $\alpha,\beta$-unsaturated dicarboxylic anhydride may be a compound represented by the following formula (II), the specific examples being maleic anhydride, citraconic anhydride and chloromaleic anhydride.

(II)

In the formula (II), $R^1$ and $R^2$ each stand for the same as the $R^1$ and $R2$ defined with respect to the formula (I).

The addition reaction of the acid anhydride may be effected in an inert solvent which dissolves only the used acid anhydride or dissolves both of the acid anhydride and the polymer of the conjugated diene generally at a temperature of from 100° C. to 250° C., examples of the inert solvents being aromatic hydrocarbons such as toluene and xylene, ketones such as methyl ethyl ketone and methyl isobutyl ketone, esters such as ethyl acetate, and ethers having no hydroxyl group such as diethyleneglycol dimethyl ether. In this reaction, a gelation inhibitor, for example, hydroquinone, dimethylhydroquinone, trimethylhydroquinone, catechols or derivatives of p-phenyldiamine may be added in an amount of preferably not more than 0.5 parts by weight, particularly preferably from 0.1 to 0.3 parts by weight, based on 100 parts by weight of the polymer of conjugated diene.

The added amount of the acid anhydride group in the resultant addition product may range generally from about 0.05 to 1.5 mols, preferably from 0.12 to 1.2 mols, based on 100 g of the polymer of conjugated diene.

The addition product obtained by the addition of acid anhydride group as aforementioned is then monoamidated by the reaction with a primary amine having 1 to 16 carbon atoms, whereby the alkali-soluble resin which is used as the component (A) of the invention is obtained.

Specific examples of the primary amines which may be used for monoamidation may be selected from the group consisting of methylamine, isopropylamine, butylamine, cyclohexylamine, laurylamine, benzylamine, aniline and mixtures thereof.

The monoamidation reaction may be represented by the following reaction formula (1), and may proceed at a relatively low temperature, for example, at a temperature of not higher than 100° C., preferably from 15 to 60° C. If the reaction temperature is high, the desired monoamidation is followed by the undesirable imitation reaction represented by the following reaction formula (2), leading to reduction in acid value of the product.

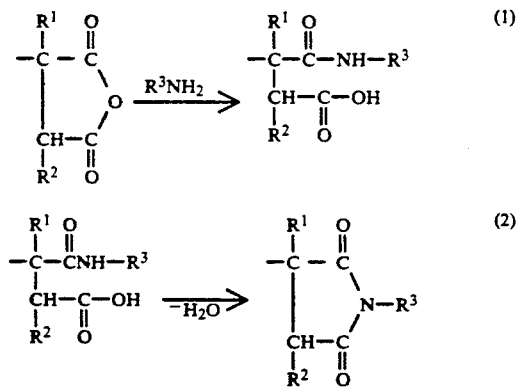

(In the reaction formulae (1) and (2) set forth above, $R^1$, $R^2$ and $R^3$ are the same as defined in the formula (I))

To provide the composition having good performance characteristics at the developing step and to form a final coating which is durable stably for a long time period, not less than 80 mol %, preferably not less than 90 mol %, of the acid anhydride groups be amidated by the reaction with the aforementioned primary amine.

The monoamidation reaction described above may preferably be carried out in the presence of a solvent. Preferable solvents are those which have no reactivity with the reactants participating in the monoamidation and have the capability of dissolving both reactants, the examples being aromatic hydrocarbons such as toluene and xylene; ketones such as methyl ethyl ketone and methyl isobutyl ketone; esters such as ethyl acetate; and ethers having no hydroxyl group such as diethyleneglycol dimethyl ether.

In the present invention, some portions of the remaining acid anhydride groups in the alkali-soluble resin (component (A)) may be subjected to ring-opening reaction while using an alcohol such as ethyl alcohol, ethyl cellosolve, phenyl cellosolve or hydroxyalkyl (meth)acrylate, or portions of monoamidated succinic acid groups may be esterified with a monoepoxy compound such as glycidyl methacrylate or phenylglycidyl to obtain esterified resins to be used as the component (A).

The pre-polymer having a photosensitive ethylenic double bond, which is used as the component (B) in the present invention, means a resin which is curable by exposure to ultraviolet ray, the examples being esters of epoxy resins, urethane resins, alkyd resins and polyester resins with acrylic acid or methacrylic acid (acrylic acid and methacrylic acid will be inclusively referred to as "(meth)acrylic acid" in the following description and appended claims). Specific examples of such esters include epoxy (meth)acrylate, urethane (meth)acrylate, alkyd (meth)acrylate and polyester (meth)acrylate, and particularly preferred are (meth)acrylates of bisphenol-A type epoxy resins and (meth)acrylates of novolak epoxy resins. More in detail, the epoxy resins used to form esters with (meth)acrylic acid within the scope of the invention are bisphenol type epoxy resins such as bisphenol-A type epoxy resins and bisphenol-F type epoxy resins; novolak epoxy resins such as phenol novolak epoxy resins and cresol novolak epoxy resins; alicyclic epoxy resins; and epoxy resins containing heterocyclic rings or spiro-rings such as triglycidyl isocyanate and a hydantoin epoxy resin. Commercially available bisphenol type epoxy resins include, for example, "Epikote 828", "Epikote 834", "Epikote 836", "Epikote 1001", "Epikote 1004" and "Epikote 1007" (Trade Names; produced by Yuka Shell Epoxy K.K.), and "Araldite 260", "Araldite 280", "Araldite 6071", "Araldite 6084", and "Araldite 6097" (Trade Names; produced by Ciba-Geigy AG). These epoxy resins may be used singly or in combination.

Examples of commercially available novolak epoxy reins include "Epikote 152", "Epikote 154" and "Epikote 180" (Trade Names; produced by Yuka Shell Epoxy K.K.), and "Araldite EPN1138", "Araldite EPN1139", "Araldite EON1235", "Araldite EON1273", "Araldite EON1280" and "Araldite EON1299" (Trade Names; produced by Ciba-Geigy AG), and "DEN431" and "DEN438" (Trade Names; produced by Dow Chemical Corp.). These commercially available novolak epoxy resins may be used singly or in combination with the same type or other type epoxy resins.

The component (B) used in the present invention may be prepared by any of the conventional processes. As one example, the process for preparing epoxy (meth)acrylate will be described. The epoxy (meth)acrylate may be prepared, for example, by reacting one of the epoxy resins referred to above with (meth)acrylic acid in the presence of an esterification catalyst generally at a temperature of from 60° C. to 130° C., preferably from 80° C. to 110° C. In this reaction, the mixing ratio of the epoxy resin and (meth)acrylic acid ranging such that preferably 0.1 to 1.0 chemical equivalent, particularly preferably from 0.5 to 1.0 chemical equivalent, of (meth)acrylic acid is mixed with one chemical equivalent of the used epoxy resin.

Known catalysts, such as triphenyl phosphine and dimethylbenzylamine, may be used as the esterification catalyst, the added ratio thereof ranging generally from 0.05 to 10 wt. %, preferably from 0.1 to 5 wt. %, based on the total weight of the liquid reaction mixture.

In preparation of these epoxy (meth)acrylate, it is preferred to add a polymerization inhibitor, such as hydroquinone, 2,4-dimethyl-6-t-butylphenol, p-benzoquinone, phenothiazine, or N-nitrophenylamine, and it suffices that the amount of added polymerization inhibitor ranges from about 0.01 to 1 wt. %.

The reaction for preparing the aforementioned epoxy (meth)acrylate may be carried out in an organic solvent which is inert and also acts as a viscosity depressant.

Examples of the organic solvents, which may be used for such purpose, include ketones such as methyl ethyl ketone and cyclohexanone; esters such as ethyl cellosolve acetate, and ethyl acetate; ethers such as 1,4-dioxane, tetrahydrofuran, diethylene glycol and dimethyl ether; alcohols such as ethyl cellosolve and phenyl cellosolve; aromatic hydrocarbons such as toluene and xylene; and petroleum base solvents such as petroleum ether and petroleum naphtha.

Other than the aforementioned epoxy resins, glycidylated products of polyvinyl phenols or the like may be used as the starting materials for the epoxy (meth)acrylates.

Generally known photopolymerization initiators may be used for the photopolymerization initiators, i.e. the component (C), in the present invention. Specific examples of the photopolymerization initiators include, in addition to benzoin, benzoin methyl ether, benzoin ethyl ether, benzoin butyl ether, benzyl, Michler's ketone, ets., commercial products such as "Ingacure 184", "Irgacure 651" and "Irgacure 907"(Trade Names; produced by Ciba-Geigy AG) and "Dalocure-1173" (Trade name; produced by Merk & Co., Inc.).

In the resin composition for forming the durable protection coating, according to the invention, in order to form a coating of higher reliability, it is essential that the mixing ratio of the alkali-soluble resin or component (A) to the pre-polymer or component (B) should be in the range of from 1:4 to 4:1, preferably from 3:7 to 7:3. If the mixing ratio of either one component (A) or (B) is less than 1, namely the mixing ratio of the other component exceeding 4, the properties of the resultant coating, such as the moistureproof properties, resistance to hydrolysis and adhesiveness of the coating, become inferior.

The most important factor to be taken into account when the mixing ratio between the alkali-soluble resin (A) and the prepolymer (B) is set, is the acid value of the alkali-soluble resin (A). In detail, if the acid value of the alkali-soluble resin (A) in the resin composition is high, even the exposed portions of the coating become soluble at the developing step unless the mixing ratio is limited below some proper level. On the contrary, if the acid value of the alkali-soluble resin (A) is low, even the unexposed portions of the coating become insoluble in the used alkaline developer unless the mixing ratio thereof is increased. Accordingly, in order to make it possible to form ultrafine patterns of micron size, it is important to use the alkali-soluble resin (A) and the pre-polymer (B) in a mixing ratio set depending on the particular acid value of the used alkali-soluble resin (A) in respective resin compositions of the invention. For example, when an alkali-soluble resin (A) having an acid value of 160 is used, the mixing ratio of the alkali-soluble resin (A) to the pre-polymer (B) ranges from 7:3 to 1:1.

The amount of the component (C) essentially admixed to the composition of the invention may range preferably form 0.1 to 15 parts by weight, particularly preferably from 1 to 10 parts by weight, based on 100 parts by weight of the total weight of the components (A) and (B). It is neither preferred to add the component (C) in a ratio of less than 0.1 part by weight, nor preferred to add it in the ratio of more than 15 parts by weight, since the strength of the photosensitive coating is lowered in both cases.

The resin composition for forming the durable protection coating, according to the invention, may contain a polymerization inhibitor in addition to the aforementioned components (A), (B) and (C). Examples of such a polymerization inhibitor include, hydroquinone, 2,6-di-tert-butyl-p-cresol, p-benzoquinone, hydroquinone monomethyl ether, phenothiazine and α-naphtylamine.

The resin composition of the invention may contain a still further component within a limit not to cause tack of the formed coating. Some of monomers which may be additionally contained in the resin composition of the invention are conventionally known photopolymerizable monomers including, for example, 2-ethylhexyl acrylate, 2-hydroxyethyl acrylate, 1,3-butanediol acrylate, trimethylolpropane triacrylate, pentaerythritol triacrylate, 2-ethylhexyl methacrylate, 2-hydroxyethyl methacrylate, 1,3-butanediol methacrylate, trimethylolpropane trimethacrylate, pentaerythritol trimethacrylate, etc., and other higher melting point monomers, such as tri(acryloyloxyethyl) isocyanurate. These monomers may be used singly or in combination.

The resin composition for forming a durable protection coating, according to the present invention, may be prepared for example by mixing a composition containing the components (A), (B) and (C), or followed by dissolving the mixture.

The process for forming a durable protection coating from the resin composition of the invention will now be described.

According to the invention, a durable or lasting protection coating is formed through the steps of coating the resin composition for forming the durable protection coating on a substrate, exposing the coating to ultraviolet ray through a circuit-forming pattern to cure the exposed portion or portions, and removing the unexposed portion or portions of the coating by development with an alkali followed by after-curing. The green resin composition may, in general, be coated on the substrate without any treatment, or may be diluted with a diluent, such as organic solvents, and then coated on the substrate when it is necessary to adjust the viscosity of the green resin composition. Organic solvents which may be used as the diluent are not particularly limited and various known organic solvents may be used as far as they dissolve the resin composition of the invention to provide a uniform diluted resin composition, the examples including water-soluble organic solvents such as ethyl cellosolve, butyl cellosolve, ethyleneglycol dimethyl ether, diacetone alcohol, 4-methoxy-4-methylpentanone-2 and methyl ethyl ketone, and non-aqueous organic solvents such as xylene, toluene, methyl isobutyl ketone and 2-ethylhexanol.

It is preferred that the resin composition or the diluted solution thereof have a viscosity measured by a rotary viscometer at ambient temperature of from 0.1 to 1,000 poises in general, preferably from about 1 to about 500 poises. One or more inorganic fillers may also be added to the resin composition or the diluted solution thereof, if necessary. Examples of the inorganic fillers are mica, clay, talc, alumina white, diatomaceous earth, bentonite, quarz, aluminum hydroxide, calcium hydroxide, barium sulfate, magnesium silicate, titanium oxide, zinc oxide, silica alumina and silicon nitride.

Any one or more of the inorganic fillers referred to above may be added in an amount of from 0 to 160 parts by weight, preferably from 40 to 150 parts by weight, based on 100 parts by weight of the resin composition.

In addition, dyes or pigments such as Phthalocyanine Blue, Phthalocyanine Green, Cyanine Green, titanium white, Titan Yellow, carbon black, chrome yellow, Hanza Yellow, Lake Red, Methyl Violet, Brilliant Green and Victoria Blue and/or antimony pentaoxide or the like for retarding firing may also be added.

The resin composition may be coated on the substrate usually by dip coating, roller coating, curtain coating or the like methods. Drying of the formed coating may be effected by drying with hot air or using far infrared rays at a temperature of preferably from not higher than 120° C., particularly preferably within the range of from 60 to 100° C., generally for about 10 to 20 minutes. Drying temperature at this stage may not exceed 120° C., since the coating is liable to be thermoset.

The coating formed as aforementioned does not exhibit tack at ambient temperature and has a smooth surface to be used as a superlative photosensitive coating.

After drying the coating, a negative film bearing thereon a circuit pattern mask is placed on the coating, followed by the steps of irradiating ultraviolet ray from a high pressure mercury lamp, an ultra high pressure mercury lamp, a xenon lamp, a metal halide lamp, etc. to cure the portions of the coating exposed to ultraviolet ray, developing subsequently by spraying a developer solvent or by dipping the coating into the developer solvent, and then removing the portions of coating unexposed to ultraviolet ray, for example, by rinsing.

An aqueous alkali solution, such as a 1 to 5 wt. % aqueous solution of sodium carbonate, may be used commonly as the developer solvent, with or without the addition of a proper surface active agent and/or another solvent which is miscible with water.

Then, after drying with hot air, after-curing of the coating is effected to convert the amidated succinic acid groups in the coating into imidated succinic acid groups. After-curing may be effected generally at 100° C. to 180° C., preferably from 140° C. to 170° C. for about 10 to 60 minutes, whereby a durable protection coating is formed. Insufficient after-curing renders the coating unsatisfactory in stability for long time use, whereas excessive after-curing is disadvantageous in production efficiency.

Since the resin composition for forming a durable protection coating, provided in accordance with the present invention, is curable upon exposure to ultraviolet ray and can be developed with an alkali, a dense protection coating can be produced efficiently. Yet, the durable protection coating produced by the process of the invention is improved over the protection coatings formed from conventional resin compositions which are cured by exposure to ultraviolet ray and developed with an alkali, in that it forms a highly reliable layer having superior moistureproof properties, resistance to chemicals and hydrolysis, and improved adhesiveness. Since carboxylic acid groups in the protection coating left in the durable protection coating of the invention are removed or converted into non-corrosive groups by after-curing, according to a further advantageous feature of the invention, there is no fear that copper wiring on the printed circuit board is not corroded. Accordingly, the performance characteristics of the thus protected printed circuit board can be preserved for a long time period. Furthermore, the cross-linking density of the resinous composition is increased to provide another merit that the resultant coating is excellent even when it is coated to form a thick layer.

EXAMPLES OF THE INVENTION

The present invention will now be described more specifically with reference to some Examples thereof. However, it is to be noted here that the invention should not be construed as being limited to the following Examples.

EXAMPLE 1

Initially, a monoamidated product of a polymer of maleated butadiene was prepared to be used as the component (A) for the durable protection coating resin composition.

Into a 1-liter separable flask provided with a reflux cooling tube and a nitrogen feed tube, charged were 323 g of a liquid polybutadiene having a number average molecular weight of 1,000 and a viscosity at 25° C. of 14 poises and containing 65% of 1,2-bonds, the polybutadiene having been prepared by polymerizing butadiene at 30° C. in the presence of toluene acting as a chain transferring agent while using benzyl sodium as a catalyst, 178.9 g of maleic anhydride, 10 g of xylene and 1.2 g of a polymerization inihibitor (produced and sold by Sumitomo Chemical Co., Ltd. under the Trade Name of "Antigen 6C"). The charged ingredients were allowed to react at 190° C. for 5 hours under a nitrogen stream. Then, unreacted maleic anhydride and xylene were distilled off to synthesize a polymer of maleated butadiene having a total acid value of 400 mg KOH/g. The thus prepared polymer had a softening point (softening point measured by the ring and ball test stipulated by JIS-K-2531-60) was 88° C.

Then, 200 g of the polymer of maleated butadiene and 200 g of diethyleneglycol dimethyl ether were charged into a 1-liter separable flask provided with a reflux cooling tube, and the flask was dipped in an oil bath maintained at 80° C. while gently stirring the content in the flask to dissolve the polymer of maleated butadiene completely, and then the content in the flask was cooled to 40° C., After adding a solution containing 76.4 g of benzylamine and 76.4 g of diethyleneglycol dimethyl ether at 40° C. over a period of 2 hours, the reaction was continued for additional 15 hours to obtain a monoamidated product of the polymer of maleated butadiene having a varnish acid value of 69 mg KOH/g. The thus obtained monoamidated product was used as the component (A).

Separately, a bisphenol type epoxy acrylate was synthesized through the following procedure to be used as a component (B).

Into a 1-liter separable flask provided with a reflux cooling tube, charged were 200 g of "Epikote 1004" (Trade Name; produced by Yuka Shell Epoxy K.K.), 1.5 g of triphenyl phosphine, 0.8g of hydroquinone and 200 g of diethyleneglycol dimethyl ether. The flask was dipped in an oil bath maintained at 100° C. to completely dissolve the epoxy resin while gently stirring the content in the flask, and then 18 g of methacrylic acid was added into the flask over a period of 30 minutes. After the completion of adding methacrylic acid, the reaction was continued at 120° C. for 3 hours to obtain methacrylate of the epoxy resin.

Using the thus prepared components (A) and (B), a resin composition for forming a durable protection coating was prepared as follows.

60 g of the monoamidated product of the polymer of maleated butadiene serving as the component (A), 40 g of the solution of the bisphenol type epoxy methacrylate serving as the component (B), 20 g of a solution of diethyleneglycol dimethyl ether containing 50wt. % of trimethylolpropane triacrylate serving as an additional ingredient and 7 g of "Irgacure 651" (Trade Name: produced by Ciba-Geigy AG) acting as a photopolymerization initiator (component (C)) were mixed and dissolved at room temperature to obtain a resin composition for forming a durable protection coating. The content of non-volatile materials in the resultant resin composition was 52 wt. %.

The thus prepared resin composition was coated over a glass fiber reinforced, copper clad epoxy laminate using an applicator, and then the laminate was placed in a hot air drier maintained at 80° C. to dry the coating for 10 minutes, whereby a coating having a thickness of 20 μm was formed. The surface of the dried coating, after being cooled to room temperature, was touched by a finger to ascertain that the dried coating was not tacky.

Then, a polyester substrate bearing thereon a negative circuit pattern mask including a finest line width of 50 μm was placed over the coating, the pattern mask being further covered with a 1.5 mm thick quartz, and the coating was exposed in a UV exposing system (produced and sold by USHIO Inc. under the Trade Name of "High Mercury Lamp Irradiation System UVC-2518") until exposure at 365 nm reached 600 mJ/cm$^2$. Although the temperature of the coating was raised to 32° C. during the exposure step, the mask closely fitted over the coating could be easily peeled off from the coating after the completion of exposing operation.

The coating was developed with a 2 wt. % aqueous solution of sodium carbonate to find that the resolution power was finer than 50 μm.

The coating treated through the aforementioned developing operation was placed in an electric furnace to effect after-curing at 160° C. for 30 minutes to form a protection coating. The properties of the protection coating was appraised by the known methods.

Initially, the pencil hardness of the protection coating was measured generally in accordance with the JIS-D-0202 8-10 method to find that the pencil hardness was 7H.

The adhesiveness was appraised generally in accordance with a cross-hatch peeling test conducted generally in accordance with the JIS-D-0202 8-12 to reveal that the coating had good adhesiveness.

The solder-resisting properties were appraised by the method in which the circuit board coated with the aforementioned coating was dipped in a molten solder bath (264° C.) for 30 seconds, and then a cross-hatch peeling test was conducted generally in accordance with the JIS-D-0202 8-12 to ascertain that the coating cleared the test.

The moistureproof properties were appraised by boiling the circuit board for 2 hours followed by conducting a cross-hatch peeling test generally in accordance with the JIS-D-0202 8-12 method to find that the coating cleared the test.

Furthermore, the printed circuit board covered by the coating was subjected to a pressure cooker test by which the board was allowed to stand in 120° C. steam for 36 hours, and then a cross-hatch peeling test conducted generally in accordance with the JIS-D-0202 8-12. The result was that neither peeling off of the coating nor corrosion of the copper clad was found.

EXAMPLE 2

A monoamidated product of a polymer of maleated butadiene was synthesized following the procedure as described below and used as the component (A) of a resin composition for forming a durable protection coating.

Into a 1-liter separable flask provided with a reflux cooling tube and a nitrogen feed tube, charged were 258 g of the liquid polybutadiene as prepared in Example 1, 194 g of maleic anhydride, 10 g of xylene and 1.5 g of "Antigen 6C" (Trade Name, produced by Sumitomo Chemical Co., Ltd.), and the charged mixture was allowed to react at 190° C. for 4.5 hours under the nitrogen flow. Then, unreacted maleic anhydride and xylene were distilled off to synthesize a polymer of maleated butadiene having a total acid value of 480 mg KOH/g. The softening point of the thus prepared polymer was 128° C.

Thereafter, 200 g of the polymer of maleated butadiene and 277 g of ethyl cellosolve acetate were charged into a 1-liter separable flask provided with a reflux cooling tube to dissolve the polymer completely and then cooled to 40° C. After adding 45.9 g of benzylamine and 31.2 g of n-butylamine over a period of 1.5 hours, the reaction was continued for additional 13 hours, whereby a monoamidated product of the polymer of maleated butadiene having a varnish acid value of 82 mg KOH/g was prepared to be used as the component (A).

Separately, an epoxy acrylate to be used as the component (B) was synthesized as follows.

Into a 1-liter separable flask, charged were 200 g of "Epikote 180" (Trade Name; produced by Yuka Shell Epoxy K.K.), 3 g of dimethylbenzylamine, 0.8 g of hydroquinone and 200 g of ethyl cellosolve acetate, and the flask was dipped in an oil bath maintained at 100° C., and then the content in the flask was stirred gently to dissolve the epoxy resin completely and 64 g of acrylic acid was added over a period of 30 minutes. After the completion of addition of acrylic acid, the reaction was allowed to proceed at 100° C. for additional 7 hours, whereby an acrylate was obtained.

A resin composition for forming a durable protection coating was prepared while using the components (A) and (B) in the manner as described below.

60 g of a solution of the monoamidated product serving as the component (A), 40 g of a solution of the novolak epoxy acrylate serving as the component (B), 10 g of diethyleneglycol dimethyl ether solution containing 50 wt. % of trimethylolpropane triacrylate serving as an additional ingredient and 7 g of "Irgacure 907" (Trade Name; produced by Ciba-Geigy AG) acting as a photopolymerization initiator were mixed and dissolved at room temperature to prepare a resin composition for forming a durable protection coating. The content of non-volatile matters in the composition was 52 wt. %.

A coating was formed similarly as in Example 1 while using the composition prepared by Example 2. The surface of the coating was touched by a finger at ambient temperature after the completion of coating and drying to find that the coating exhibited no tack.

Following the procedures similar to those described in Example 1, a protection layer or coating was formed through exposure, development and after-curing. The resolution power of the coating was 50 μm.

The properties of the thus formed coating was appraised, similarly to Example 1, to find that the pencil hardness was 7H, and the coating had satisfactory adhesiveness, with the results that the coating cleared required solder resisting properties and moistureproof properties.

Furthermore, the printed circuit board covered by the coating was subjected to a pressure cooker test by which the board was allowed to stand in 120° C. steam for 48 hours, and then a cross-hatch peeling test was conducted to find that neither peeling off of the coating nor corrosion of the copper clad was found.

EXAMPLE 3

A monoamidated product of a polymer of maleated butadiene was synthesized following the procedure as described below and used as the component (A) of a resin composition for forming a durable protection coating.

Following a similar procedure as described in Example 1, 300 g of a liquid polybutadiene having a number average molecular weight of 1800 and containing 66% of 1,2-bonds was reacted with 115 g of maleic anhydride to synthesize a polymer of maleated butadiene having a total acid value of 320 mg KOH/g.

200 g of the polymer of maleated butadiene was charged into a 1-liter separable flask together with 260 0g of diethyleneglycol dimethyl ether, and the content of the flask was stirred to be dissolved in an oil bath maintained at 80° C., and then the content in the flask was cooled to 45° C. After adding 60 g of benzylamine over a period of an hour, the reaction was continued for additional 10 hours to obtain a solution of monoamidated product of the polymer of maleated butadiene having a vernish acid value of 55 mg KOH/g. The thus obtained monoamidated product was used as the component (A).

A solution of the bisphenol type epoxy resin acrylate synthesized in Example 1 was used as the component (B).

70 g of the component (A), 30 g of the component(B), 10 g of diethyleneglycol dimethyl ether containing 50 wt. % of trimethylolpropane triacrylate as an additional ingredient, and 7 g of "Irgacure 651" (Trade Name; produced by Ciba-Geigy AG) were mixed together to be dissolved at room temperature to prepare a resin composition for forming a durable protection layer or coating.

Following the procedures similar to those described in Example 1, a protection layer or coating was formed through exposure, development and after-curing. The resolution power of the coating was 50 μm.

The properties of the thus formed coating was appraised, similarly to Example 1, to find that the pencil hardness was 7H, and the coating had satisfactory adhesiveness, with the results that the coating cleared required solder resisting properties and moistureproof properties.

Furthermore, the printed circuit board covered by the coating was subjected to a pressure cooker test by which the board was allowed to stand in 120° C. steam for 24 hours, and then a cross-hatch peeling test was conducted to find that neither peeling off of the coating nor corrosion of the copper clad was found.

Although the present invention has been described with reference to the specific examples, it should be understood that various modifications and variations can be easily made by those skilled in the art without departing from the spirit of the invention. Accordingly, the foregoing disclosure should be interpreted as illustrative only and is not to be interpreted in a limiting sense. The present invention is limited only by the scope of the following claims.

What is claimed is:

1. A resin composition for forming a durable protection coating comprising:
   (A) an alkali-soluble resin which is a polymer of a conjugated diene and has a monoamidated succinic acid group represented by the following formula (I) of:

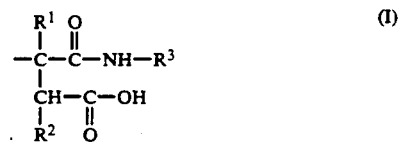

wherein $R^1$ and $R^2$ each stand for a hydrogen atom, a halogen atom or an organic residue having 1 to 3 carbon atoms; and $R^3$ stands for an organic residue having 1 to 16 carbon atoms;
   (B) a pre-polymer having a photosensitive ethylenic double bond; and
   (C) a photopolymerization initiator; a mixing ratio by weight of said alkali-soluble resin (A) to said pre-polymer (B) ranging from 1:4 to 4:1.

2. The resin composition according to claim 1, wherein said polymer of the conjugated diene is selected from the group consisting of a homopolymer of the conjugated diene, a copolymer of the conjugated diene and mixtures thereof.

3. The resin composition according to claim 2, wherein said homopolymer of the conjugated diene is an oligomer of a conjugated diolefin selected from the group consisting of butadiene, isoprene and mixtures thereof.

4. The resin composition according to claim 2, wherein said copolymer of said conjugated diene is selected from the group consisting of a low polymerization degree copolymer prepared by copolymerizing a conjugated diolefin selected from the group consisting of butadiene, isoprene and mixtures thereof with a monomer selected from the group consisting of isobutyrene, diisobutylene, styrene, α-methylstyrene, vinyltoluene, divinyltoluene and mixtures thereof.

5. The resin composition according to claim 1, wherein a ratio of numbers of vinyl groups present in said polymer of said conjugated diene is not less than 50% by weight, based on total numbers of unsaturated double bonds present in said polymer.

6. The resin composition according to claim 1, wherein number average molecular weight of said polymer of the conjugated diene ranges from 500 to 5,000.

7. The resin composition according to claim 1, wherein said organic residue having 1 to 3 carbon atoms in said formula (I) is selected from the group consisting of a methyl group, an ethyl group and a propyl group.

8. The resin composition according to claim 1, wherein said organic residue having 1 to 16 carbon atoms in said formula (I) is selected from the group consisting of a methyl group, an isopropyl group, a butyl group, a cyclohexyl group, a lauryl group and a benzyl group.

9. The resin composition according to claim 1, wherein a content of the monoamidated succinic acid group in said alkali-soluble resin ranges from 0.05 to 1.5 mols, based on 100 g of said polymer of the conjugated diene.

10. The resin composition according to claim 1, wherein said alkali-soluble resin is prepared by adding an acid anhydride group of an $\alpha,\beta$-unsaturated dicarboxylic anhydride to said polymer of the conjugated diene, followed by monoamidation with a primary amine having 1 to 16 carbon atoms.

11. The resin composition according to claim 10, wherein said $\alpha,\beta$-unsaturated dicarboxylic anhydride is a compound represented by the following formula (II) of:

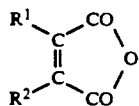

(II)

wherein $R^1$ and $R^2$ each stand for a hydrogen atom, a halogen atom or an organic residue having 1 to 3 carbon atoms.

12. The resin composition according to claim 10, wherein said $\alpha,\beta$-unsaturated dicarboxylic anhydride is selected from the group consisting of maleic anhydride, citraconic anhydride, chloromaleic anhydride and mixtures thereof.

13. The resin composition according to claim 10, wherein said acid anhydride group is added in an amount of from 0.05 to 1.5 mols per 100 g of said polymer of the conjugated diene.

14. The resin composition according to claim 10, wherein said primary amine having 1 to 16 carbon atoms is selected from the group consisting of methylamine, isopropylamine, butylamine, cyclohexylamine, laurylamine, benzylamine, aniline and mixtures thereof.

15. The resin composition according to claim 10, wherein said monoamidation is effected at a reaction temperature of not higher than 100° C.

16. The resin composition according to claim 10, wherein not less than 80 mol % of said acid anhydride group is amidated by said amidation.

17. The resin composition according to claim 1, wherein said pre-polymer (B) having the photosensitive ethylenic double bond is an esterification product of a resin selected from the group consisting of epoxy resins, urethane resins, alkyd resins, polyester resins and mixtures thereof with (meth)acrylic acid.

18. The resin composition according to claim 17, wherein said esterification product is selected from the group consisting of epoxy (meth)acrylates, urethane (meth)acrylates, alkyd (meth)acrylates, polyester (meth)acrylates, (meth)acrylates of bisphenol type epoxy resins, (meth)acrylates of novolak type epoxy resins and mixtures thereof.

19. The resin composition according to claim 17, wherein said epoxy resin is selected from the group consisting of bisphenol-A type epoxy resins, bisphenol-F type epoxy resins, phenol novolak type epoxy resins, cresol novolak type epoxy resins, triglycidyl isocyanate, hydantoin epoxy resins and mixtures thereof.

20. The resin composition according to claim 1, wherein said photopolymerization initiator (C) is selected from the group consisting of benzoin, benzoin methyl ether, benzoin ethyl ether, benzoin butyl ether, benzyl, Michler's ketone and mixtures thereof.

21. The resin composition according to claim 1, wherein said photopolymerization initiator (C) is added in an amount of from 0.1 to 15 parts by weight, based on 100 parts by weight of the total weight of said alkali-soluble resin (A) plus said pre-polymer (B) having the photosensitive ethylenic double bond.

22. The resin composition according to claim 1, further comprising a polymerization inhibitor selected from the group consisting of hydroquinone, 2,6-di-tert-butyl-p-cresol, p-benzoquinone, hydroquinone monomethyl ether, phenothiazine, $\alpha$-naphthylamine and mixtures thereof.

23. The resin composition according to claim 1, further comprising a monomer selected from the group consisting of 2-ethylhexyl acrylate, 2-hydroxyethyl acrylate, 1,3-butanediol acrylate, trimethylolpropane triacrylate, pentaerythritol triacrylate, 2-ethylhexyl metacrylate, 2-hydroxyethyl methacrylate, 1,3-butanediol methacrylate, trimethylolpropane trimethacrylate, pentaerythritol trimethacrylate, tri(acryloyloxyethyl) isocyanurate and mixtures thereof.

* * * * *

UNITED STATES PATENT AND TRADEMARK OFFICE
CERTIFICATE OF CORRECTION

PATENT NO. : 5,096,800
DATED : March 17, 1992
INVENTOR(S) : Hitoshi Yuasa, Eiji Yoda, Haruyoshi Sato, Yutaka Otsuki It is certified that error appears in the above-identified patent and that said Letters Patent is hereby corrected as shown below:

Column 16, line 48, in Claim 23    delete "metacrylate"
    insert ---methacrylate---

Signed and Sealed this

Eighth Day of June, 1993

Attest:

MICHAEL K. KIRK

Attesting Officer    Acting Commissioner of Patents and Trademarks